US012772556B2

(12) United States Patent
Yun et al.

(10) Patent No.: US 12,772,556 B2
(45) Date of Patent: Oct. 20, 2026

(54) 3D-STACKED SEMICONDUCTOR DEVICE MANUFACTURED USING CHANNEL SPACER

(71) Applicant: SAMSUNG ELECTRONICS CO., LTD., Suwon-si (KR)

(72) Inventors: Seungchan Yun, Waterford, NY (US); Jaejik Baek, Watervliet, NY (US); Kang-ill Seo, Springfield, VA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 376 days.

(21) Appl. No.: 18/380,476

(22) Filed: Oct. 16, 2023

(65) Prior Publication Data

US 2025/0031444 A1 Jan. 23, 2025

Related U.S. Application Data

(60) Provisional application No. 63/527,414, filed on Jul. 18, 2023.

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC ............ H10D 30/6735; H10D 64/018; H10D 84/0167; H10D 84/017; H10D 88/01; H10D 84/0147; H10D 84/013; H10D 84/83
See application file for complete search history.

(56) References Cited

U.S. PATENT DOCUMENTS 11,502,167 B2 11/2022 Hong et al.
11,688,767 B2 6/2023 Li et al.
(Continued)

OTHER PUBLICATIONS

European Extended Search Report issued Nov. 13, 2024 by the European Patent Office for EP Patent Application No. 24188865.0.

*Primary Examiner* — Ismail A Muse
(74) *Attorney, Agent, or Firm* — Myers Bigel, P.A.

(57) ABSTRACT

Provided is a three-dimension (3D) stacked semiconductor device which includes: a 1$^{st}$ source/drain region connected to a 1$^{st}$ channel structure; and a 2$^{nd}$ source/drain region, above the 1$^{st}$ source/drain region, connected to a 2$^{nd}$ channel structure above the 1$^{st}$ channel structure, wherein the 2$^{nd}$ channel structure has a smaller length than the 1$^{st}$ channel structure in a channel-length direction, in which the 2$^{nd}$ source/drain region is connected to a 3$^{rd}$ source/drain region through the 2$^{nd}$ channel structure.

16 Claims, 18 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 88/00*** | (2025.01) |

(52) U.S. Cl.
CPC ..... *H10D 30/6735* (2025.01); *H10D 30/6757* (2025.01); *H10D 62/121* (2025.01); *H10D 62/151* (2025.01); *H10D 64/017* (2025.01); *H10D 64/018* (2025.01); *H10D 84/0167* (2025.01); *H10D 84/017* (2025.01); *H10D 84/038* (2025.01); *H10D 88/01* (2025.01)

(56) References Cited

U.S. PATENT DOCUMENTS

| | | | | |
|---|---|---|---|---|
| 2019/0196830 | A1 | 6/2019 | Lilak et al. | |
| 2022/0109046 | A1 * | 4/2022 | Hong ................. | H10D 30/6735 |
| 2023/0076270 | A1 | 3/2023 | Kim et al. | |
| 2023/0086084 | A1 | 3/2023 | Yun et al. | |
| 2023/0163185 | A1 * | 5/2023 | Fulford ................ | H10D 62/121 257/233 |
| 2023/0178440 | A1 | 6/2023 | He et al. | |
| 2023/0197830 | A1 | 6/2023 | Chan et al. | |

* cited by examiner

3D-STACKED SEMICONDUCTOR DEVICE MANUFACTURED USING CHANNEL SPACER

CROSS-REFERENCE TO THE RELATED APPLICATION

This application is based on and claims priority from U.S. Provisional Application No. 63/527,414 filed on Jul. 18, 2023 in the U.S. Patent and Trademark Office, the disclosure of which is incorporated herein in its entirety by reference.

BACKGROUND

1. Field

Apparatuses and methods related to the disclosure relate to a three dimension stacked (3D-stacked) or multi-stack semiconductor device in which source/drain regions are formed using channel spacers.

2. Description of the Related Art

A 3D-stacked semiconductor device including a lower transistor and an upper transistor stacked thereon has been introduced in response to increased demand for an integrated circuit having a high device integration density and performance. Each of the lower and upper transistors may be a fin field-effect transistor (FinFET), a nanosheet transistor or any other type of transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure and a gate structure surrounding all four surfaces of each of the nanosheet channel layers. The nanosheet transistor is referred to as gate-all-around (GAA) transistor, or as a multi-bridge channel field-effect transistor (MBCFET).

However, formation of an upper source/drain region for the upper transistor and a lower source/drain region for the lower transistor of the 3D-stacked semiconductor device presents various challenges including difficulties in isolating the two source/drain regions from each other. This issue arises because the lower source/drain region is vertically overlapped by the upper source/drain region in the 3D-stacked semiconductor device. Moreover, as the contact poly pitch (CPP) or gate pitch is scaled down to achieve even a higher-density 3D-stacked semiconductor device, formation of the lower source/drain region and the upper source/drain regions in a nanometer-scale area between gate structures becomes more challenging than before.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a 3D-stacked semiconductor device in which source/drain regions are formed using a channel spacer formed at side surfaces of one or more upper channel layers for an upper transistor. The channel spacer may block the upper channel layers when a lower source/drain region is formed from one or more lower channel layers, and the channel spacer may be removed to expose the upper channel layers so that an upper source/drain region can be formed from the upper channel layers.

According to an embodiment, there is provided a 3D-stacked semiconductor device which may include: a $1^{st}$ source/drain region connected to a $1^{st}$ channel structure; and a $2^{nd}$ source/drain region, above the $1^{st}$ source/drain region, connected to a $2^{nd}$ channel structure above the $1^{st}$ channel structure, wherein the $2^{nd}$ channel structure has a smaller length than the $1^{st}$ channel structure in a channel-length direction, in which the $2^{nd}$ source/drain region is connected to a $3^{rd}$ source/drain region through the $2^{nd}$ channel structure.

According to an embodiment, there is provided a 3D-stacked semiconductor device which may include: a $1^{st}$ source/drain region connected to a $1^{st}$ channel structure; and a $2^{nd}$ source/drain region, above the $1^{st}$ source/drain region, connected to a $2^{nd}$ channel structure above the $1^{st}$ channel structure, wherein the $2^{nd}$ source/drain region has a greater length than the $1^{st}$ source/drain region in a channel-length direction, in which the $2^{nd}$ source/drain region is connected to a $3^{rd}$ source/drain region through the $2^{nd}$ channel structure.

According to an embodiment, there is provided a 3D-stacked semiconductor device which may include: a $1^{st}$ source/drain region connected to a $1^{st}$ channel structure; a $2^{nd}$ source/drain region, above the $1^{st}$ source/drain region, connected to a $2^{nd}$ channel structure above the $1^{st}$ channel structure; a gate structure surrounding the $1^{st}$ channel structure and the $2^{nd}$ channel structure; a $1^{st}$ inner spacer between a $1^{st}$ portion of the gate structure and the $1^{st}$ source/drain region; and a $2^{nd}$ inner spacer between a $2^{nd}$ portion of the gate structure and the $2^{nd}$ source/drain region, wherein the $2^{nd}$ inner spacer has a smaller length than the $1^{st}$ inner spacer in a channel-length direction, in which the $2^{nd}$ source/drain region is connected to another $2^{nd}$ source/drain region through the $2^{nd}$ channel structure.

According to an embodiment, there is provided a method of manufacturing a 3D-stacked semiconductor device. The method may include: providing a semiconductor stack including a $1^{st}$ channel layer and a $2^{nd}$ upper channel layer above the $1^{st}$ channel layer; partially recessing the $2^{nd}$ channel layer from at least one side surface thereof such that a side recess is formed at the at least one side surface, while the $1^{st}$ channel layer is passivated by a passivation structure; forming a channel spacer in the side recess; removing the passivation structure, and forming a $1^{st}$ source/drain region based on the $1^{st}$ lower channel layer; and removing the channel spacer, and forming a $2^{nd}$ source/drain regions based on the $2^{nd}$ channel layer.

BRIEF DESCRIPTION OF DRAWINGS

Example embodiments of the disclosure will be more clearly understood from the following detailed description taken in conjunction with the accompanying drawings in which.

DETAILED DESCRIPTION OF EXAMPLE EMBODIMENTS

Figure 1:
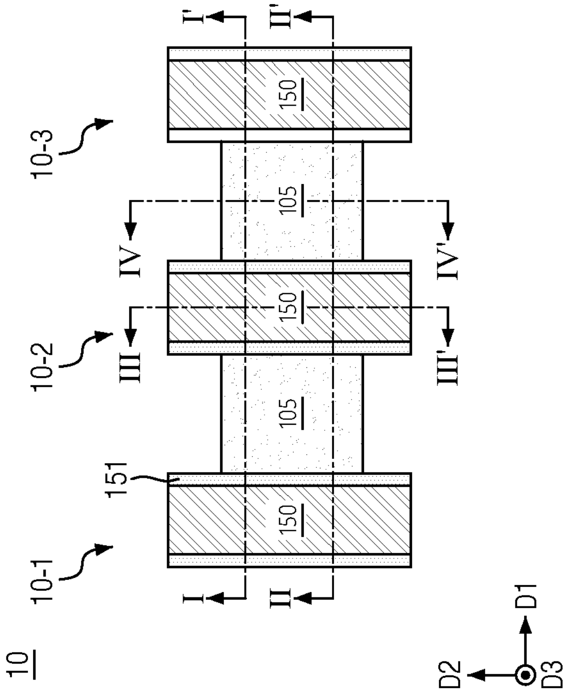
FIG. 1 illustrates a top plan view of an intermediate semiconductor device prepared to manufacture a 3D-stacked semiconductor device in which source/drain regions are formed based on channel spacers, according to an embodiment.

The embodiments of the disclosure described herein are example embodiments, and thus, the disclosure is not limited thereto, and may be realized in various other forms. Each of the embodiments or examples provided in the following description is not excluded from being associated with one or more features of another embodiment or another example also provided herein or not provided herein but consistent with the disclosure. For example, even if matters described in a specific embodiment or example are not described in a different embodiment or example thereto, the matters may be understood as being related to or combined with the different embodiment or example, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, source/drain regions, gate structures, channel layers, spacers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed in the descriptions of embodiments could be termed a $2^{nd}$ element in claims without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments. For example, the disclosure omits descriptions of materials of a substrate (e.g., silicon, germanium, etc.), a source/drain region (e.g., silicon doped with p-type or n-type impurities), and a gate structure (e.g., copper (Cu), aluminum (Al), cobalt (Co), tungsten (W), titanium (Ti), tantalum (Ta) or their combination).

FIG. 1 illustrates a top plan view of an intermediate semiconductor device prepared to manufacture a 3D-stacked semiconductor device in which source/drain regions are formed based on channel spacers, according to an embodiment. FIGS. 2A-2D to 12A-12D illustrate intermediate semiconductor devices obtained after respective steps of forming a 3D-stacked semiconductor device based on the intermediate semiconductor device of FIG. 1, according to embodiments.

FIGS. 2A-12A are cross-section views of the intermediate semiconductor device of FIG. 1 along a line I-I' shown therein in a D1 direction. FIGS. 2B-12B are cross-section views of the intermediate semiconductor device of FIG. 1 along a line II-II' shown therein in a D1 direction. FIGS. 2C and 10C-12C are cross-section views of the intermediate semiconductor device of FIG. 1 along lines III-III', and FIGS. 2D and 10D-12D are cross-section views of the intermediate semiconductor device of FIG. 1 along lines IV-IV', respectively, shown therein in a D2 direction.

It is to be understood that FIG. 1 is provided to show only a positional relationship between a substrate and dummy gate structures formed on channel structures to assist an understanding of the cross-sectional views of FIGS. 2A-2D to 12A-12D, and thus, not all structural elements shown in these cross-sectional view are shown in FIG. 1. Here, the D1 direction is a channel-length direction along which source/drain regions are connected to each other through a channel structure, and the D2 direction is a channel-width direction that intersects the D1 direction. A D3 direction is a vertical direction intersecting the D1 and D2 directions which are both a horizontal direction.

Referring to FIGS. 1 and 2A-2D, an intermediate semiconductor device 10 may include a plurality of semiconductor stacks 10-1, 10-2 and 10-3 on a substrate 105.

The three semiconductor stacks 10-1, 10-2 and 10-3 may be obtained by dividing a single initial semiconductor stack formed on the substrate 105 through, for example, operations of lithography, masking and top-down etching, to provide two recesses R1 and R2 exposing a top surface of the substrate 105. In the two recesses R1 and R2 will be formed lower source/drain regions and upper source/drain regions in a later step of manufacturing a 3D-stacked semiconductor device. The lower source/drain regions may form a lower transistor along with a lower gate structure which is also to be formed in a later step. The upper source/drain regions may form an upper transistor in the 3D-stacked semiconductor device along with an upper gate structure in a later step. Herebelow, the upper gate structure and the lower gate structure may be collectively referred to as a gate structure when they are configured to receive a common gate input signal when the 3D-stacked semiconductor device is completed from the intermediate semiconductor device 10. However, the upper gate structure and the lower gate structure may be formed to be isolated from each other, according to another embodiment.

The initial semiconductor stack, before it is divided into the three semiconductor stacks 10-1, 10-2 and 10-3, may be formed by epitaxially growing a plurality of lower sacrificial layers 111, lower channel layers 112, a channel isolation layer 117, upper sacrificial layers 121 and upper channel layers 122 from the substrate 105 in an alternating manner. The sacrificial layers 111 and 121 are referred to as such because these layers will be replaced by a gate structure in a later step. The lower channel layers 112 and the upper channel layers 122 will respectively form lower current channels of a lower transistor and upper current channels of an upper transistor of a 3D-stacked semiconductor device in a later step. Herein, the lower sacrificial layers 111 and the lower channel layers 112 are collectively referred to as a lower channel structure 110, and the upper sacrificial layers 121 and the upper channel layers 122 are collectively referred to as an upper channel structure 120.

Figure 2B:
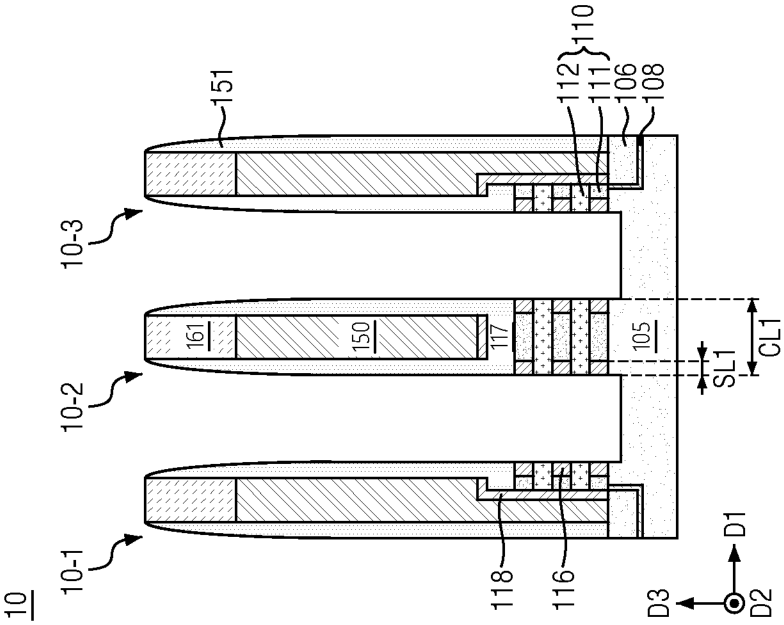
FIGS. 2A-2D to 12A-12D illustrate intermediate semiconductor devices obtained after respective steps of forming a 3D-stacked semiconductor device based on the intermediate semiconductor device of FIG. 1, according to embodiments.
Figure 2A:
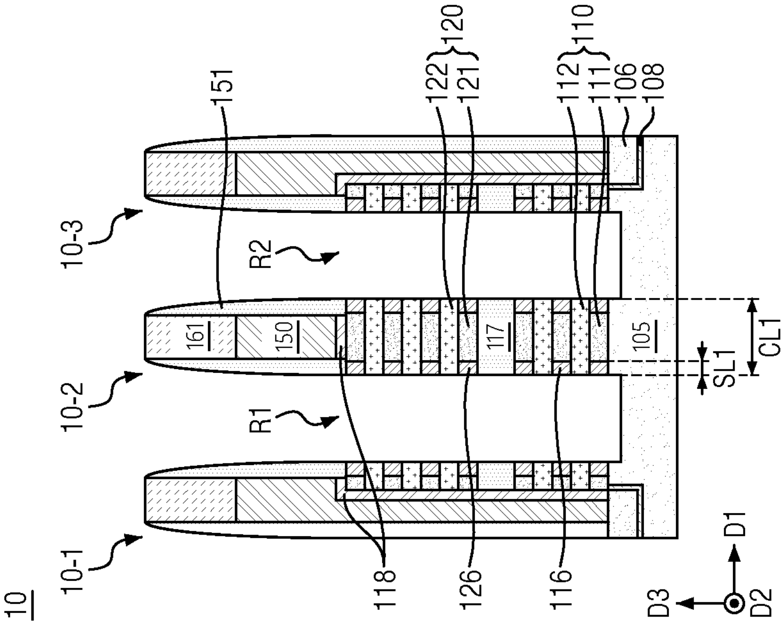
Figure 2C:
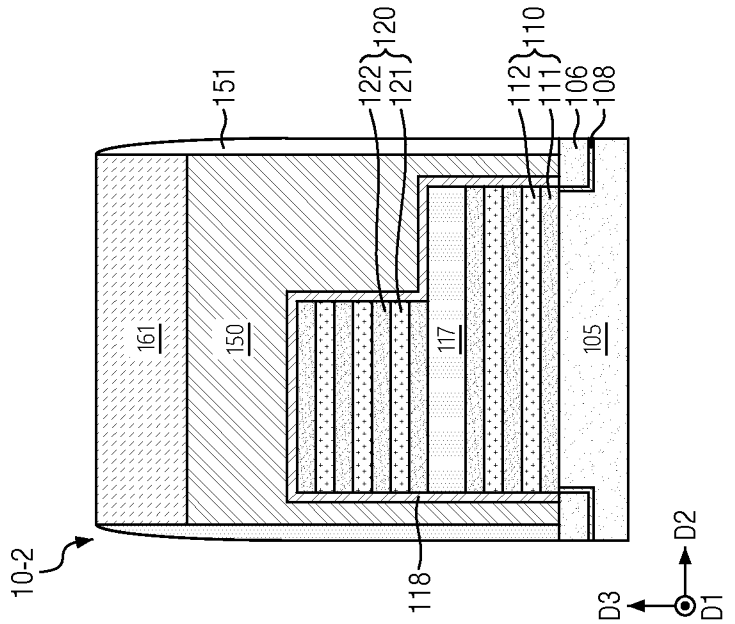
Figure 2D:
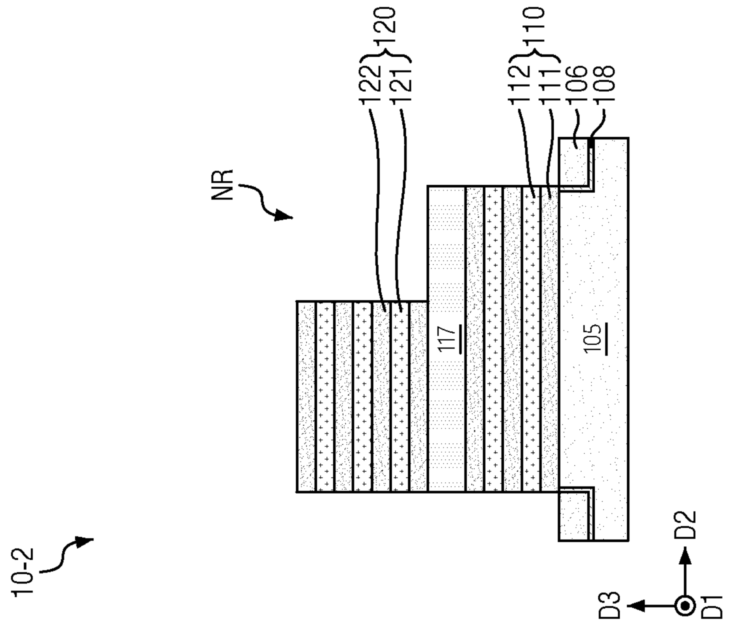

FIGS. 2C and 2D show that the upper channel structure 120 including the upper sacrificial layers 121 and the upper channel layers 122 may have a smaller channel width in the D2 direction than the lower channel structure 110 including the lower sacrificial layers 111 and the lower channel layers 112. This configuration of the channel structures for a 3D-stacked semiconductor device may be intended to facilitate formation of a lower contact structure on a top surface of a lower source/drain region to be epitaxially grown from the lower channel layers 112 in a later step. For example, when the upper channel layers 122 and the lower channel structure 110 have the same channel width, the upper source/drain region and the lower source/drain region epitaxially grown therefrom may also have the same width, and thus, the lower source/drain region may be entirely overlapped by the upper source/drain region in the D3 direction, and thus, a lower contact structure may not be formed on a top surface of the lower source/drain region to connect the lower source/drain region to a back-end-of-line (BEOL) structure in an upper portion of the 3D-stacked semiconductor device. In this case, the lower contact structure may be formed on a side surface of the lower source/drain region, which may increase the footprint of the 3D-stacked semiconductor device.

Thus, as shown in FIGS. 2C and 2D, the upper channel structure 120 may be formed to have a smaller width than the lower channel structure 110 so that the lower source/drain region to be epitaxially grown from the lower channel layers 112 therefrom may also have a smaller width than the lower source/drain region to be epitaxially grown from the upper channel layers 122, thereby to form a non-overlapping region NR above the lower source/drain region. Through this non-overlapping region NR, the lower contact structure may be extended down from the BEOL structure and connected to the top surface of the lower source/drain region.

After the lower channel structure 110 and the upper channel structure 120 are stacked with the channel isolation layer 117 therebetween to form the initial semiconductor stack, the initial semiconductor stack may be patterned to form a shallow trench isolation (STI) structure 106 that will isolate the intermediate semiconductor device 10 from an adjacent device such as another intermediate semiconductor device. An STI liner 108 may be formed before the STI structure 106 is formed on the substrate 105.

Each of the semiconductor stacks 10-1, 10-2 and 10-3 may include a dummy gate structure 150 with a hard mask pattern 161 thereon. When the initial semiconductor stack is patterned and divided into the semiconductor stacks 10-1, 10-2 and 103, an initial dummy gate structures included therein may also have been patterned so that the dummy gate structure 150 is formed on the channel structures 110 and 120. The dummy gate structure 150 will be replaced by the gate structure that will also replace the sacrificial layers 111 and 121 in a later step. The hard mask patterns 161 may have been used to pattern the initial semiconductor stack into the semiconductor stacks 10-1, 10-2 and 103 through lithography, masking and top-down etching operations, and may have remained on the dummy gate structure 150. The dummy gate structure 150 in each of the semiconductor stacks 10-1, 10-2 and 10-3 may be used as a masking structure when lower source/drain regions and upper source/drain regions are formed.

An oxide layer 118 may be formed on the channel structures 110 and 120 of each of the semiconductor stacks 10-1, 10-2 and 10-3 to protect these channel structures when the dummy gate structure 150 is replaced with the gate structure in each of the semiconductor stacks in a later step. The oxide layer 118 may also be formed to disable the channel structures 110 and 120 partially formed in the semiconductor stacks 10-1 and 10-3 when the 3D-stacked semiconductor device is completed in a later step. However, the semiconductor stacks 10-1 and 10-3 may be used to form lower source/drain regions and upper source/drain regions for the 3D-stacked semiconductor device in a later step.

A gate spacer 151 may be formed on side surfaces of the hard mask patterns 161 and each of the dummy gate structures 150. The gate spacer 151 will isolate or protect a gate structure which will replace each of the dummy gate structures 150 in a later step from other circuit elements.

Subsequently, the semiconductor stacks 10-1, 10-2 and 10-3 as shown in FIG. 2A may be patterned out with the recesses R1 and R2 therebetween each of which exposes the top surface of the substrate 105 and side surfaces of the lower channel structure 110 and the upper channel structure 120 of the semiconductor stacks 10-1, 10-2 and 10-3.

In addition, side surfaces of the lower sacrificial layers 111 may be etched to form lower inner spacers 116 which will isolate lower source/drain regions to be formed in the recesses R1 and R2 from a gate structure which will replace the lower sacrificial layers 111 in a later step. Similarly, side surfaces of the upper sacrificial layers 121 may be etched to form upper inner spacers 126 which will isolate upper source/drain regions to be formed in the recesses R1 and R2 from a gate structure which will replace the upper sacrificial layers 121 as well as the dummy gate structure 150 in a later step.

Thus, each of the recesses R1 and R2 may expose side surfaces of the lower channel layers 112, the lower inner spacers 116, the channel isolation layer 117, the upper channel layers 122 and the upper inner spacers 126 which may be vertically aligned or coplanar with each other.

In each of semiconductor stacks 10-1, 10-2 and 10-3, the channel layers 112 and 122 may have a same length in the D1 direction. For example, in the semiconductor stack 10-2, the lower channel layers 112 and the upper channel layers 122 may all have a length CL1. Further, in each of the semiconductor stacks 10-1, 10-2 and 10-3, the inner spacers 116 and 126 may also have a same length in the D1 direction. For example, in the semiconductor stack 10-2, the inner spacers 116 and 125 may all have a length SL1.

The substrate 105 may be a silicon (Si) substrate although it may include other materials such as silicon germanium (SiGe), silicon carbide (SiC), not being limited thereto. Each of the sacrificial layers 111 may include silicon-germanium (SiGe), and each of the channel layers 112 may include silicon (Si). The channel isolation layer 117 may also include SiGe, or silicon nitride (e.g., SiBCN), not being limited thereto. The STI structure 106 may include silicon oxide (e.g., SiO, $SiO_2$, etc.), not being limited thereto, and the STI liner 108 may include silicon nitride (e.g., SiN, $Si_3N_4$, etc.), not being limited thereto. The oxide layer 118 may be a silicon oxide layer (e.g., SiO, $SiO_2$, etc.) not being limited thereto. The dummy gate structure 150 may include polysilicon or amorphous silicon. The gate spacer 151 and the inner spacers 116 and 126 may each include silicon nitride (e.g., SiN, $Si_3N_4$, etc.) not being limited thereto. The hard mask patterns 161 may include silicon nitride or titanium nitride (e.g., SiN, $Si_3N_4$, TiN, etc.), not being limited thereto.

Figure 3B:
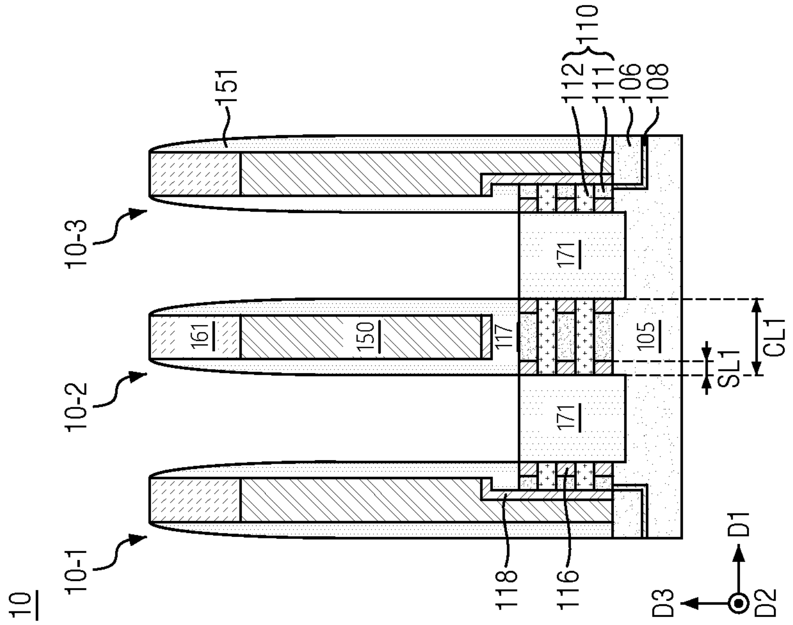
Figure 3A:
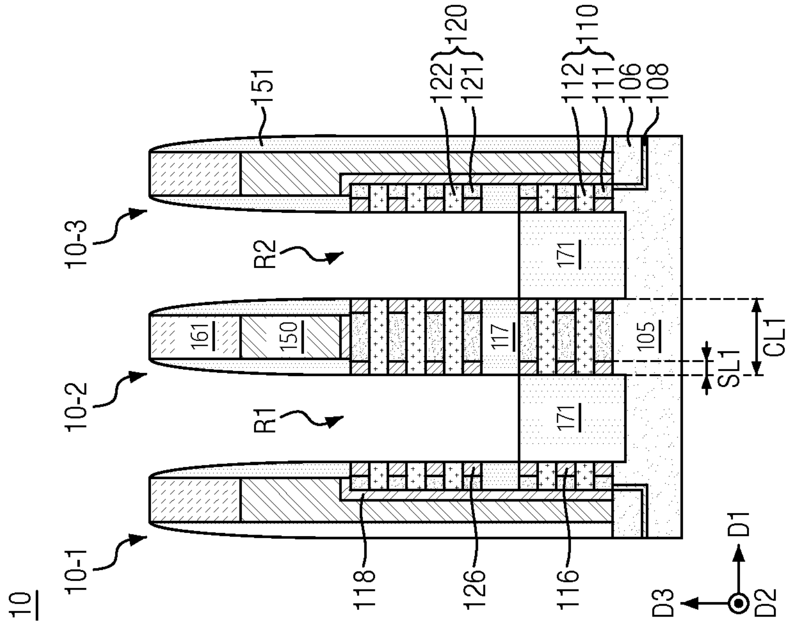

Referring to FIGS. 3A and 3B, a passivation structure 171 including a spin-on-glass (SOG) material may be formed in a lower portion of each of the recesses R1 and R2 to protect the lower channel structure 110 from a subsequent operation. The SOG material may include, for example, silicon oxide (e.g., SiO, $SiO_2$, etc.).

To form the passivation structure 171 in the lower portion of each of the recesses R1 and R2, the SOG material may be deposited in the recesses R1 and R2 through, for example, physical vapor deposition (PVD), chemical vapor deposition (CVD), plasma enhanced CVD (PECVD), or a combination thereof, and partially etched down through, for example, dry etching or wet etching to expose side surfaces of the upper channel structure 120 and the channel isolation layer 117.

It is to be understood, some cross-section views of the intermediate semiconductor device 10 corresponding to FIGS. 2C and 2D may be omitted in describing subsequent operations when they are not relevant to the novel features of the disclosure.

Figure 4A:
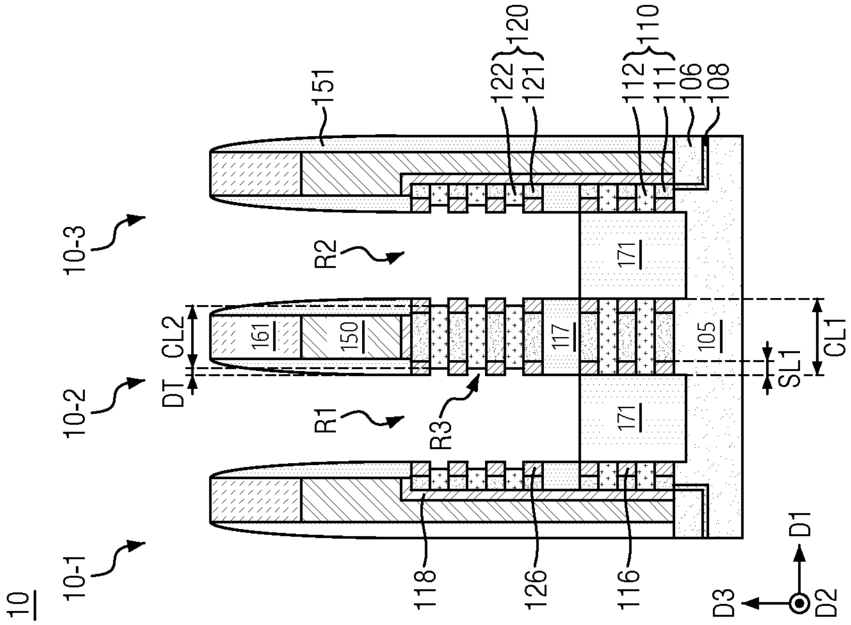
Figure 4B:
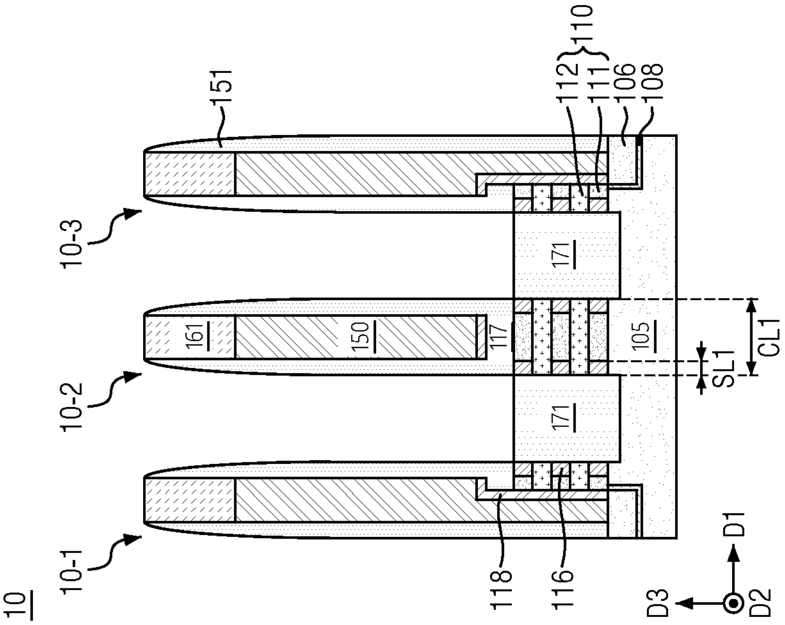

Referring to FIGS. 4A and 4B, each of the upper channel layers 122 may be partially etched from side surfaces thereof exposed in upper portions of the recesses R1 and R2, above the passivation structure 171 to form a side recess R3.

The side recess R3 may be formed in this step to provide a space in which a channel spacer is to be formed in a next step. The side recess R3 may be formed between two vertically adjacent upper inner spacers 126 such that each side surface of the upper channel layer 122 between these two upper inner spacers 126 is etched away by a side depth DT which is smaller than the length SL1 of each of the inner spacers 116 and 126.

As the side recess R3 is formed in the above manner, the length of each of the upper channel layers 122 may be reduced. For example, in the semiconductor stack 10-2, the upper channel layers 122 may each have a length CL2 which is reduced from the length CL1 by twice the side depth DT while the lower channel layers 112 passivated by the passivation structure 171 maintains the length CL1. Due to the side recess R3, the side surfaces of the upper channel layers 122 may be no longer vertically aligned or coplanar with the side surfaces of the upper inner spacers 126 and the channel isolation layer 117 in the recesses R1 and R2.

The formation of the side recess R3 may be performed through, for example, dry etching or wet etching using an etchant such as chlorine/fluorine plasma or a mixture of hydrofluoric acid (HF) and nitric acid (HNO3), not being limited thereto, to selectively etch the upper channel layer 122 formed of silicon against the upper inner spacer 126 formed of silicon nitride.

Figure 5B:
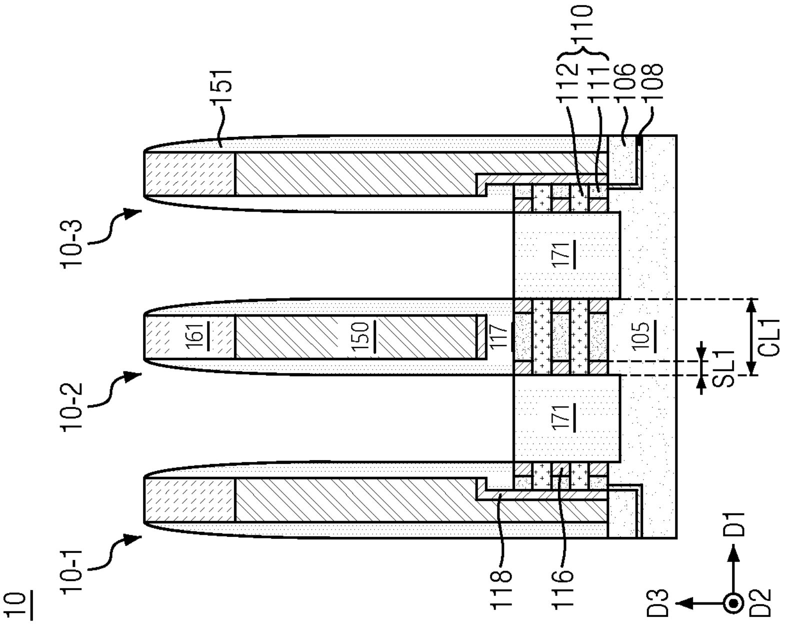
Figure 5A:
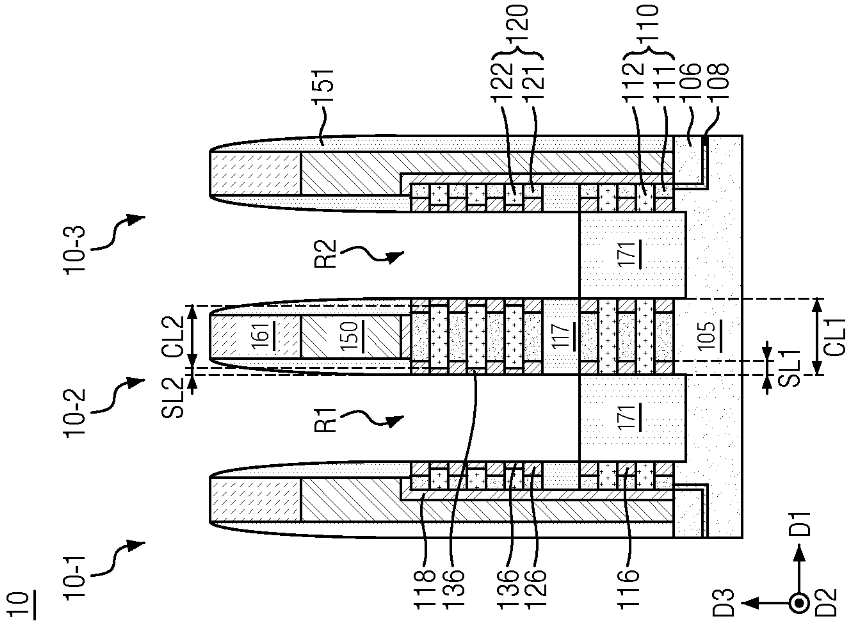

Referring to FIGS. 5A and 5B, a channel spacer 136 is formed in each of the side recesses R3 formed in the previous step.

The channel spacers 136 may be formed in the respective side recesses R3 to protect the upper channel layers 122 from subsequent operations including removal of the passivation structure 171 in a next step and formation of a lower source/drain region thereafter.

The channel spacers 136 may be formed through, for example, atomic layer deposition (ALD), PVD, CVD, PECVD, or their combination of the same material as that forming the inner spacers 116 and 126 such that side surfaces of the channel spacers 136 may be vertically aligned or coplanar with the side surfaces of the upper inner spacers 126 and the channel isolation layer 117. Thus, a length SL2 of each channel spacer 136 may be equal to the side depth DT of the side recess R3.

Figure 6B:
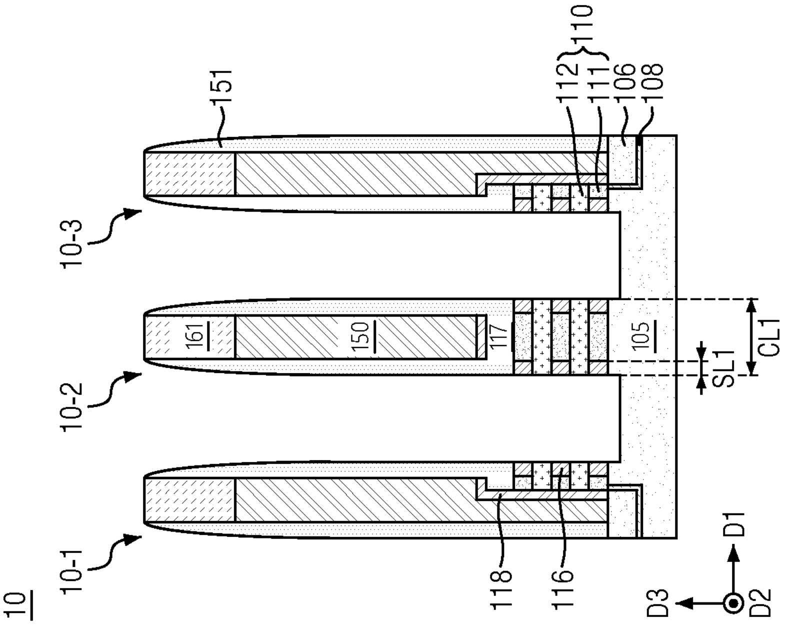
Figure 6A:
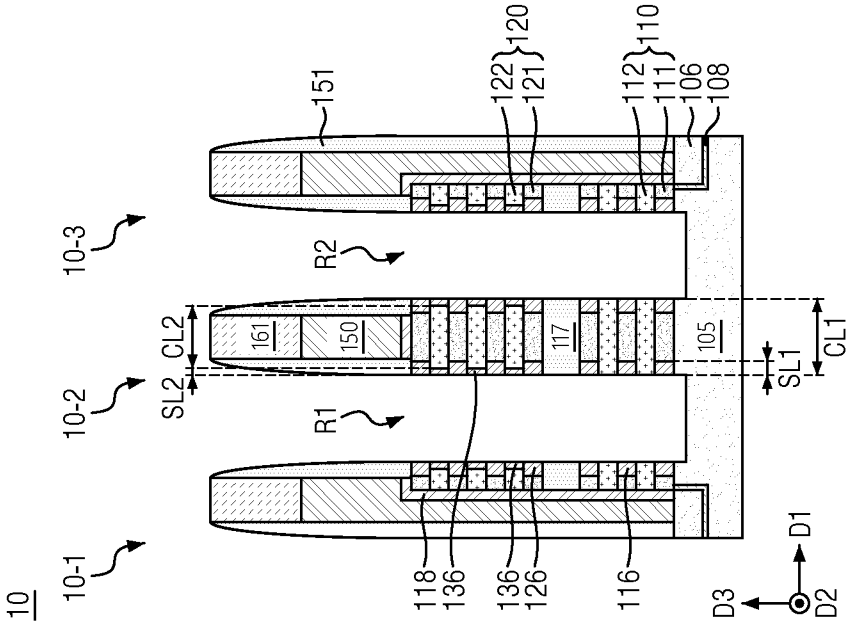

Referring to FIGS. 6A and 6B, the passivation structure 171 may be removed from the lower portion of each of the recesses R1 and R2.

The passivation structure 171 may be removed through, for example, dry etching, wet etching, stripping or ashing to expose again the top surface of the substrate 105 and the side surfaces of the lower sacrificial layer 111 and the lower channel layers 112 which may be vertically aligned or coplanar with each other on the top surface of the substrate 105.

Figure 7B:
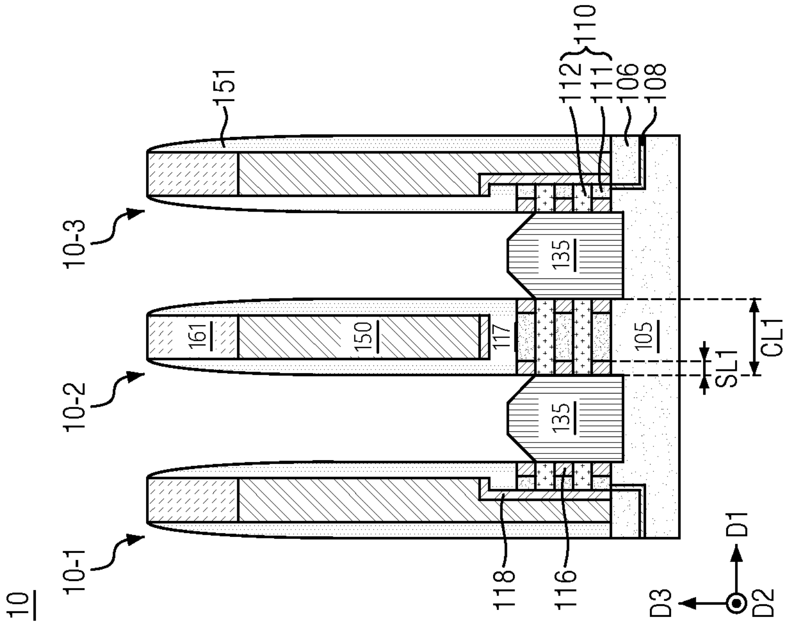
Figure 7A:
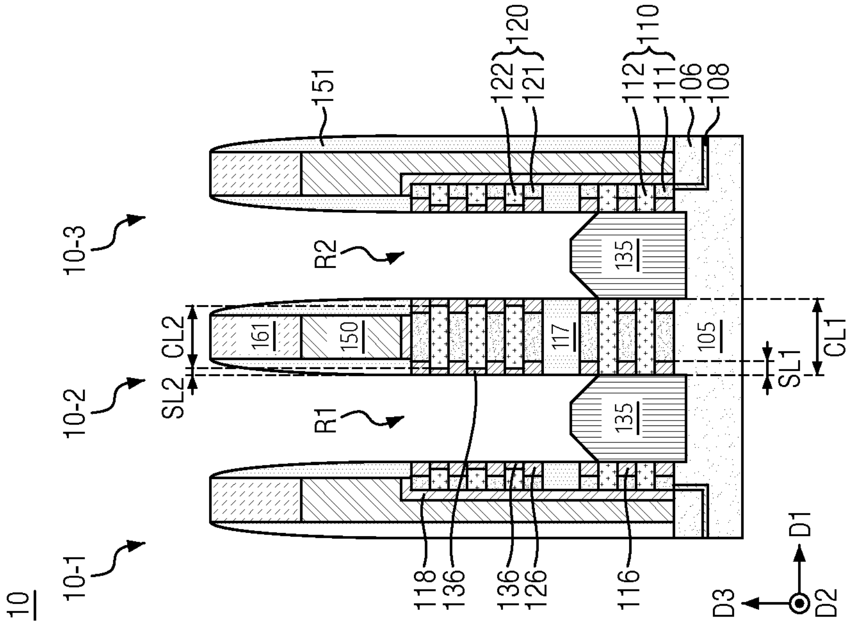

Referring to FIGS. 7A and 7B, lower source/drain regions 135 may be formed through, for example, an epitaxial growth of silicon included in the substrate 105 and the lower channel layers 112 of the semiconductor stacks 10-1, 10-2 and 10-3 exposed in the lower portions of the recesses R1 and R2.

The lower source/drain regions 135 may include the same material, such as silicon, forming the substrate 105 and the lower channel layers 112. Further, the lower source/drain regions 135 may be doped with impurities such as phosphorus (P), arsenic (As), antimony (Sb), etc. when the lower source/drain regions 135 are to be n-type source/drain regions. However, when the lower source/drain regions 135 are to be p-type source/drain regions, they may be doped with boron (B), gallium (Ga), indium (In), etc.

When a 3D-stacked semiconductor device is completed, a current will flow between the lower source/drain regions 135 through the lower channel layers 112 of the semiconductor stack 10-2 to function a lower transistor of the 3D-stacked semiconductor device.

In this step, the epitaxy forming the lower source/drain regions 135 may be selectively performed based on only the lower channel layers 112 and the substrate 105 because the upper channel layers 122 are covered by the channel spacers 136.

Figure 8A:
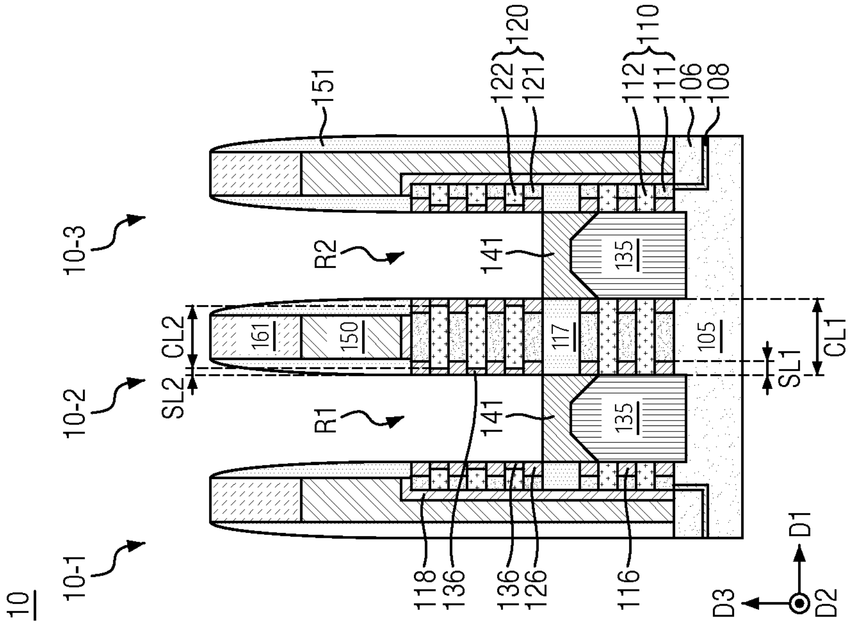
Figure 8B:
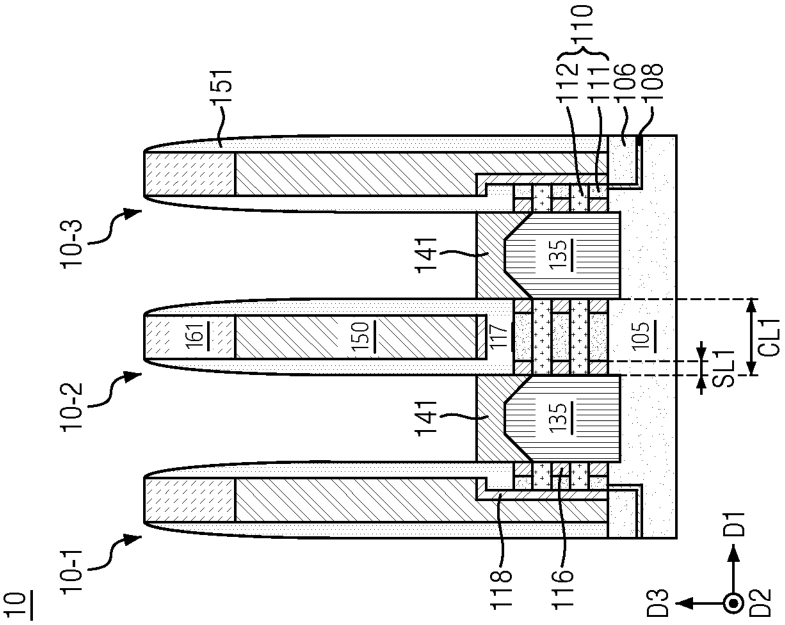

Referring to FIGS. 8A and 8B, a $1^{st}$ interlayer dielectric (ILD) layer 141 may be formed on the lower source/drain regions 135 in the lower portion of the recesses R1 and R2 to isolate the lower source/drain regions 135 from each other and from other circuit elements.

The formation of the $1^{st}$ ILD layer 141 may be performed through, for example, PVD, CVD, PECVD, or a combination thereof, followed by planarization such as CMP so that a top surface of the $1^{st}$ ILD layer 141 may be at a level of a top surface of the channel isolation layer 117.

Figure 9B:
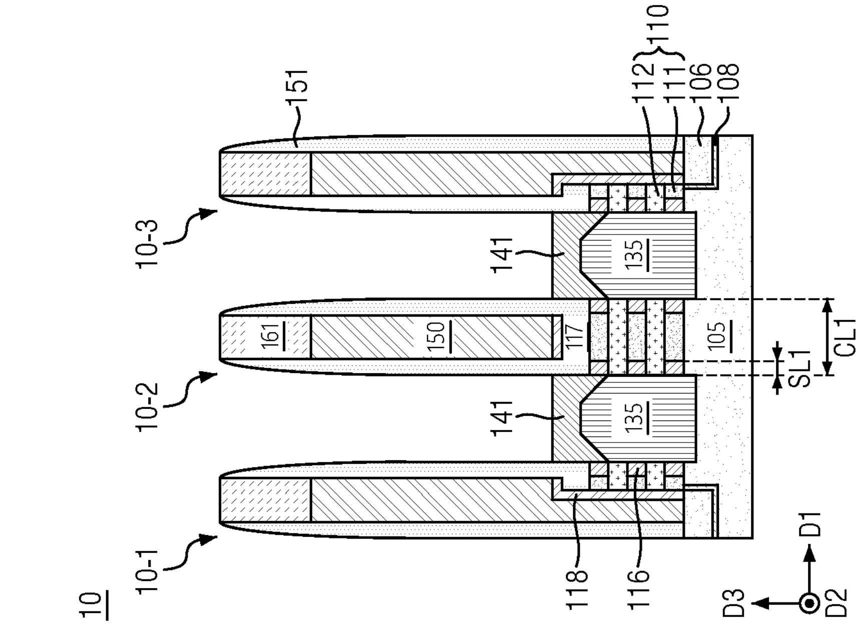
Figure 9A:
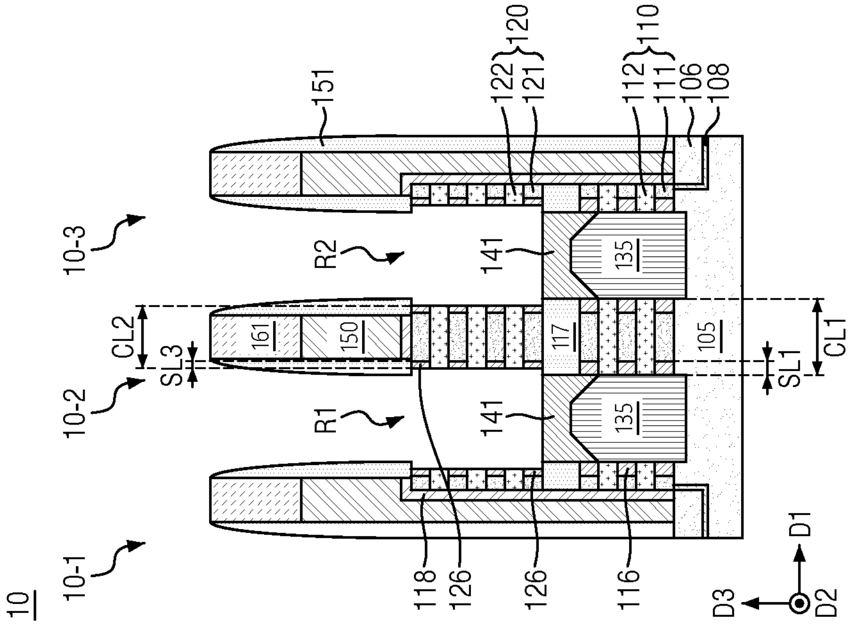

Referring to FIGS. 9A and 9B, the channel spacers 136 and corresponding portions of the upper inner spacers 126 may be removed to expose the upper channel layers 122 and remaining portions of upper inner spacers 126 in an upper portion of each of the recesses R1 and R2 so that upper source/drain regions can be performed from the upper channel layers 122 in a next step.

The removal of the channel spacers 136 may be performed through, for example, dry etching and/or wet etching. When the channel spacers 136 having the length SL2 are removed, portions of the upper inner spacers 126 vertically above and below the channel spacers 136 may also be removed by the same amount or length SL2 because the upper inner spacers 126 and the channel spacers 136 may be formed of the same silicon nitride. Still, however, the remaining portions of the upper inner spacers 126 having a length SL3 prevents the upper sacrificial layers from being exposed to the recesses R1 and R2 so that, in a next step, silicon germanium included in the upper sacrificial layers 121 does not disrupt an epitaxial growth of silicon included in the upper channel layers 122 to form upper source/drain regions in the recesses R1 and R2.

Due to the removal of the channel spacers 136 and the corresponding portions of the upper inner spacers 126, side surfaces of the upper channel layers 121 having the reduced length CL2 and side surfaces of the remaining portions of the upper inner spacers 126 exposed in the recesses R1 and R2 may become vertically aligned or coplanar with each other.

Referring to FIGS. 10A-10D, upper source/drain regions 145 may be formed through, for example, an epitaxial growth of silicon included in the upper channel layers 122 of the semiconductor stacks 10-1, 10-2 and 10-3 exposed in the upper portions of the recesses R1 and R2.

As the upper source/drain regions 145 may be epitaxially grown from the upper channel layers 122 each having the length CL2 which is smaller than the length CL1 of each of the lower channel layers 112 in the D1 direction by twice the length SL2 of the channel spacer 136 removed in the previous step, each of the upper source/drain regions 145 may have a length EL2 which may be greater than a length EL1 of the lower source/drain region 135 therebelow by twice the length SL2 of the channel spacer 136.

Figure 10B:
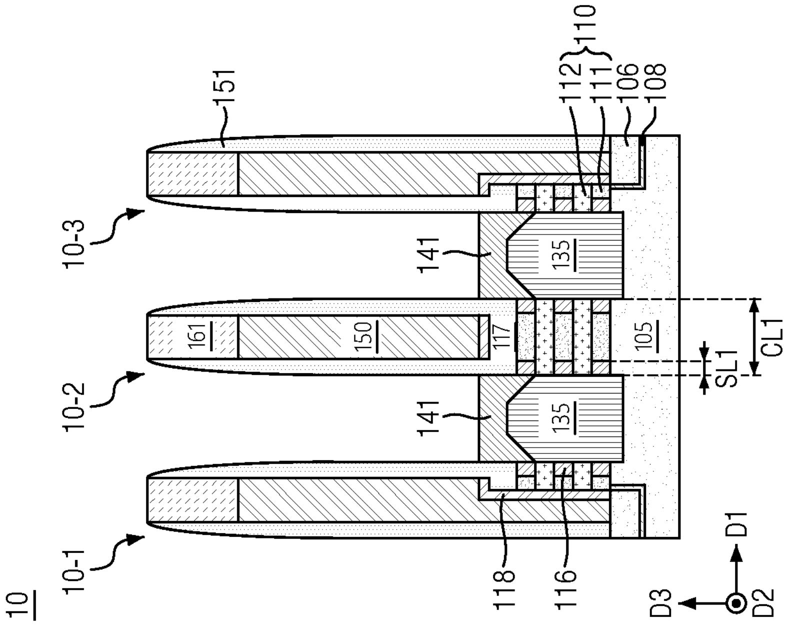
Figure 10A:
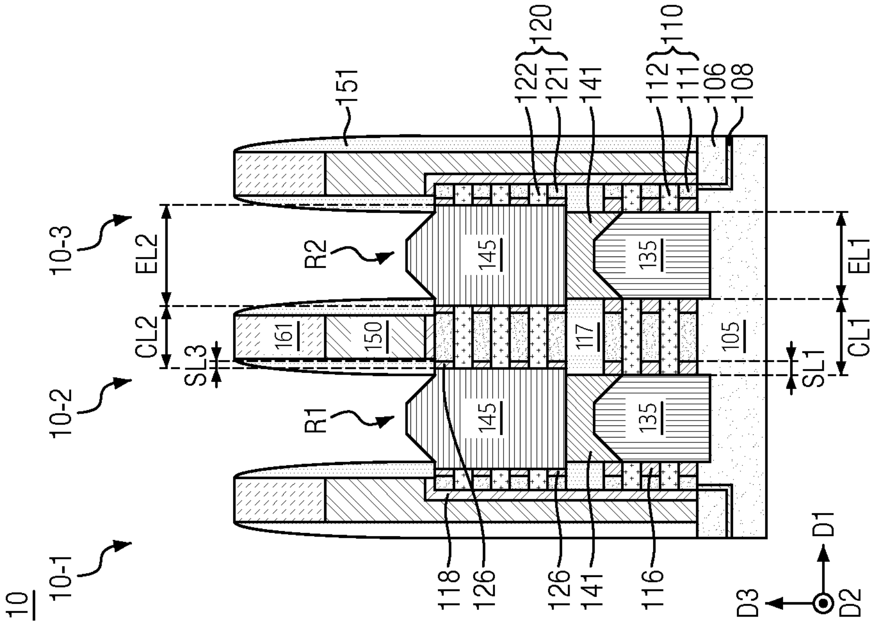
Figure 10D:
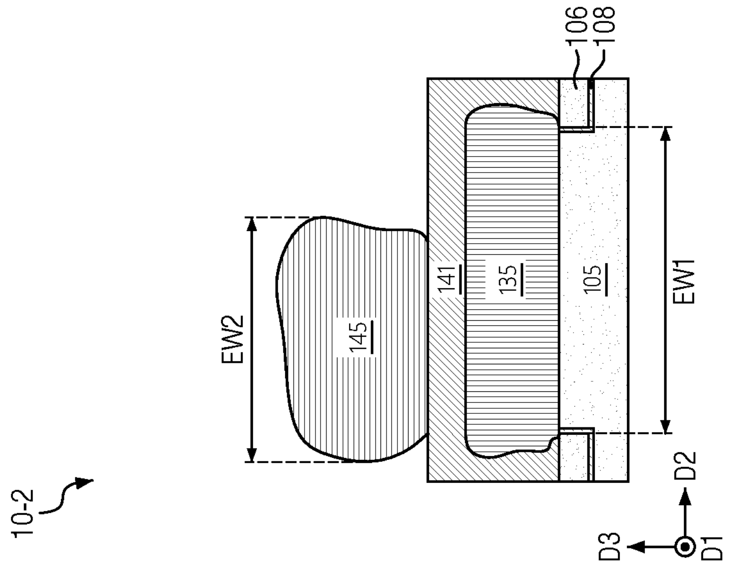
Figure 10C:
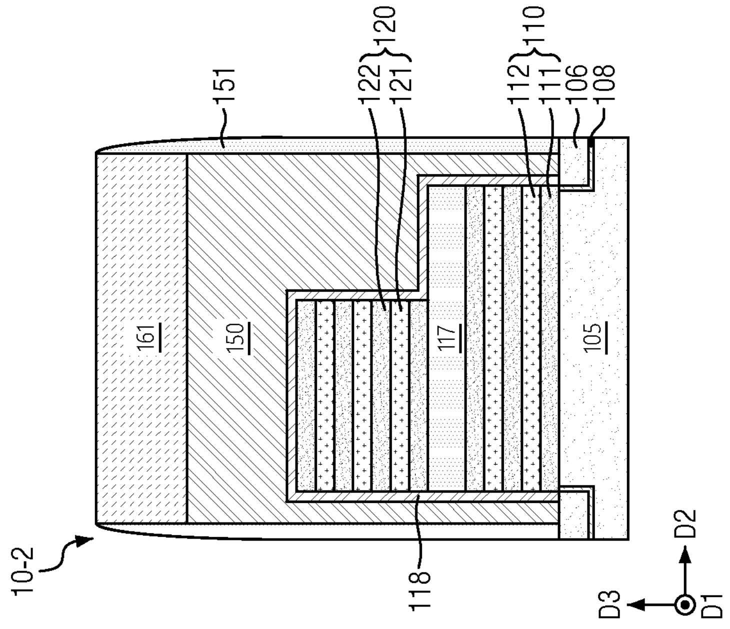
Figure 11A:
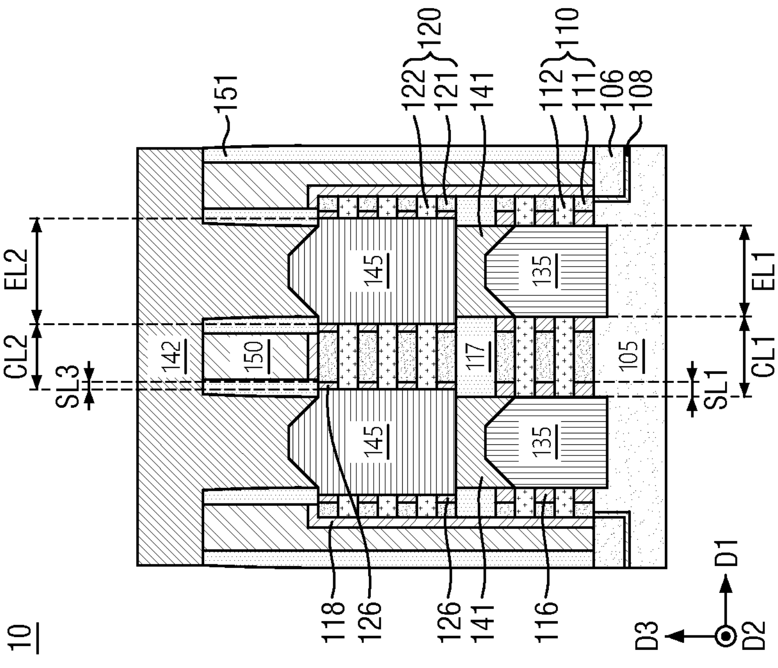
Figure 11B:
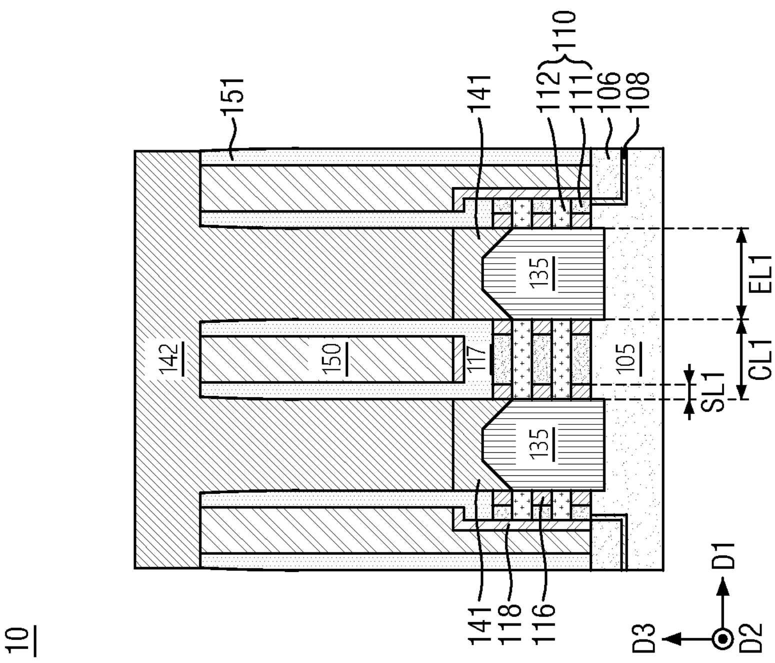
Figure 11D:
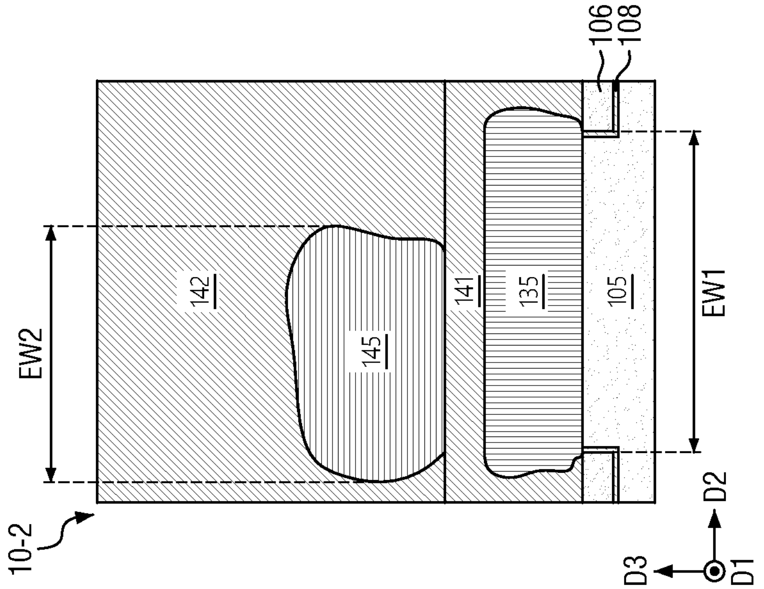
Figure 11C:
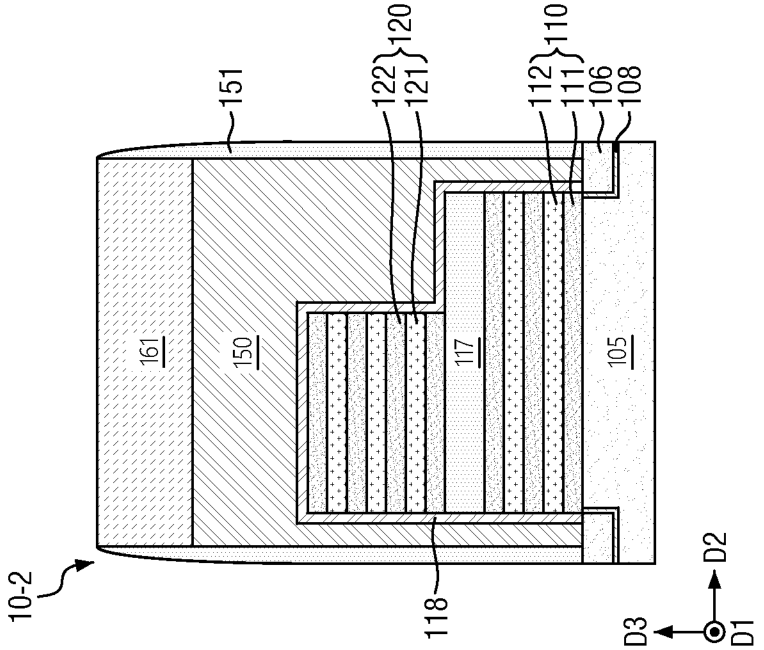

In contrast, as shown in FIG. 10D, the upper source/drain region 145 may have a width EW2 which may be smaller than a width EW1 of the lower source/drain region 135 in the D2 direction so that the lower source/drain region 135 is not entirely overlapped by the upper source/drain region 145 in the D3 direction. This is because the upper channel layers 122 from which the upper source/drain region 145 is epitaxially grown have a smaller width in the D2 direction than the lower channel layers 112 from which the lower source/drain regions 135 is epitaxially grown. Thus, as described above in reference to FIGS. 2A-2D, a lower source/drain contact structure may be formed through the non-overlapping region to contact a top surface of the lower source/drain region 135 in a later step.

The upper source/drain regions 145 may include the same material, such as silicon, forming the upper channel layers 112. Further, the upper source/drain regions 145 may be doped with impurities such as phosphorus (P), arsenic (As), antimony (Sb), etc. when the upper source/drain regions 145 are to be n-type source/drain regions. However, when the upper source/drain regions 145 are to be p-type source/drain regions, they may be doped with boron (B), gallium (Ga), indium (In), etc.

When a 3D-stacked semiconductor device is completed, a current will flow between the upper source/drain regions 145 through the upper channel layers 122 of the semiconductor stack 10-2 to function an upper transistor of the 3D-stacked semiconductor device.

Referring to FIGS. 11A-11D, the hard mask patterns 161 and portions of the gate spacers 151 at sides of the hard mask patterns 161 may be removed, and a $2^{nd}$ ILD layer 142 may be formed to surround the semiconductor stacks 10-1, 10-2 and 10-3 including the recesses R1 and R2 remaining after the previous step.

The removal of the hard mask patterns 161 and the portions of the gate spacer 151 may be performed through, for example, ashing, stripping and/or dry etching, not being limited thereto, by which upper surfaces of the dummy gate structures 150 may be exposed. The formation of the $2^{nd}$ ILD layer 142 may be performed through, for example, PVD, CVD, PECVD, or a combination thereof, of the same material forming the $1^{st}$ ILD layer 141 followed by planarization such as CMP such that the top surfaces of the dummy gate structures 150 is enclosed by the $2^{nd}$ ILD layer 142. The $2^{nd}$ ILD layer may isolate the upper source/drain regions 145 from each other and from other circuit elements.

Referring to FIGS. 12A-12D, the dummy gate structure 150 and the sacrificial layers 111 and 121 may be removed and replaced by a gate structure 155. Further, upper contact structures 129 and lower contact structures 119 may be formed to contact the upper source/drain regions 145 and the lower source/drain regions 135, respectively, through the $2^{nd}$ ILD layer 142.

The removal of the dummy gate structure 150 and the sacrificial layers 111 and 121 may be performed through, for example, dry etching, wet etching, reactive ion etching (RIE) and/or a chemical oxide removal (COR) process. The formation of the gate structure 155 may be performed through, for example, at least one of ALD, CVD, PVD, PECVD, etc. The gate structure 155 may surround the channel layers 112 and 122 as a gate structure for a lower transistor and an upper transistor of a 3D-stacked semiconductor device.

Figure 12B:
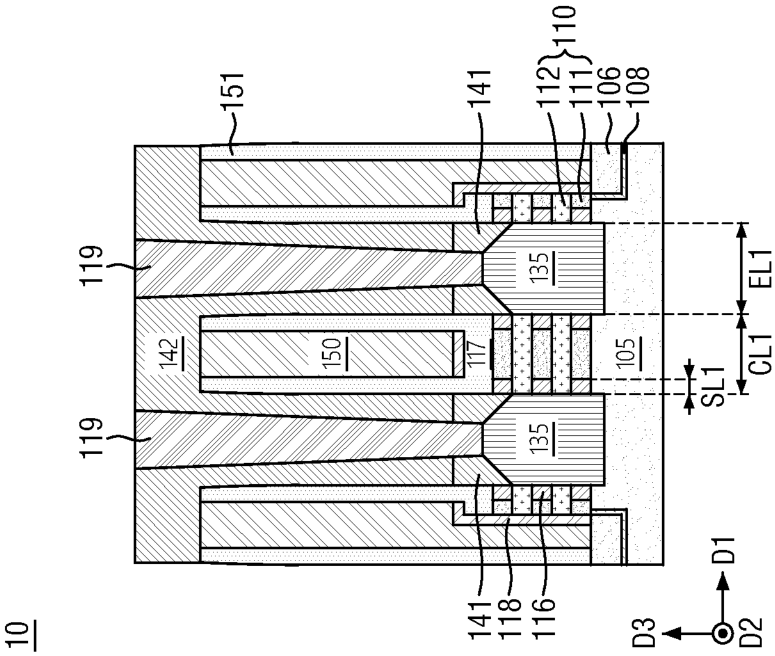
Figure 12A:
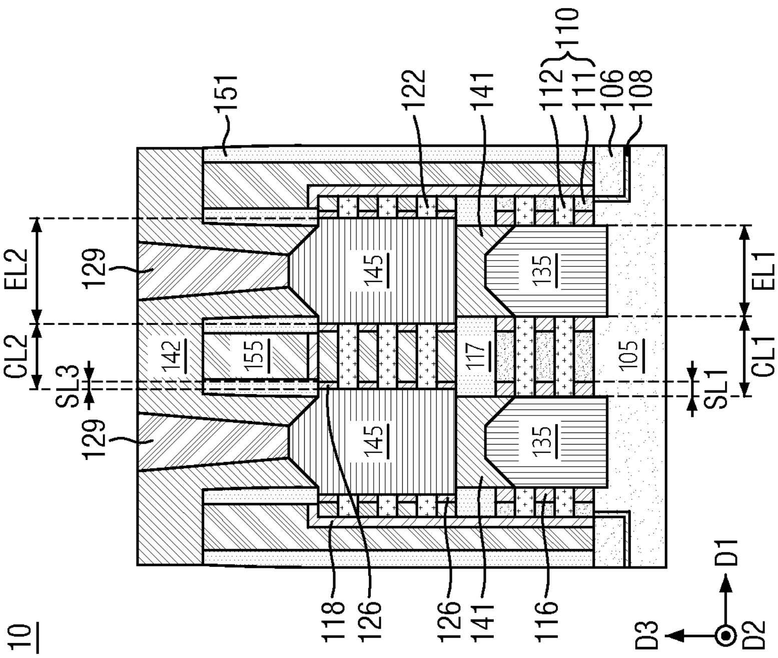
Figure 12D:
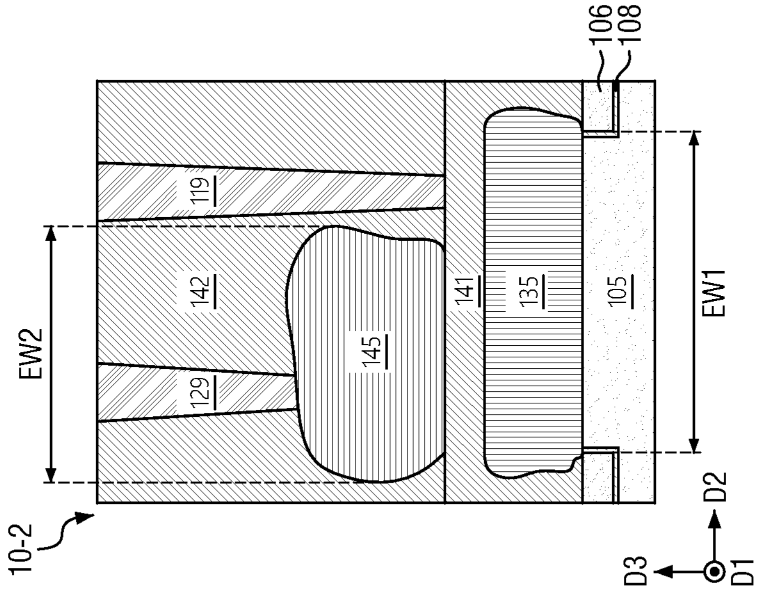
Figure 12C:
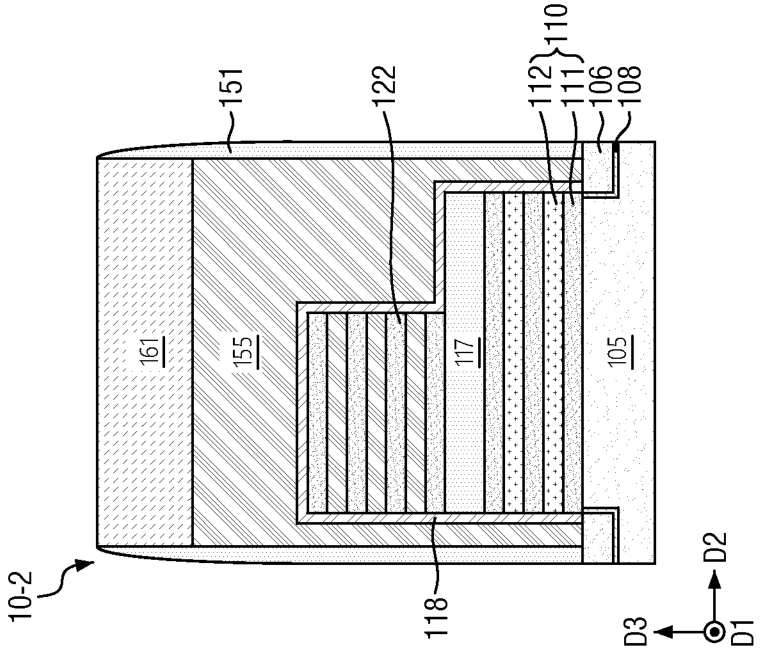

The contact structures 129 and 119 may be formed on the top surfaces of the source/drain regions 145 and 135, respectively, through, for example, photolithography, masking and etching on the $2^{nd}$ ILD layer 142, followed by depositing a meal or metal compound such as copper (Cu), aluminum (Al), cobalt (Co), tungsten (W), titanium (Ti), tantalum (Ta) or their combination. As shown in FIG. 12D, the lower contact structure 119 may be formed on the top surface of the lower source/drain region 135 due to the width different between the lower source/drain region 135 and the upper source/drain region 145 thereabove.

Figure 13:
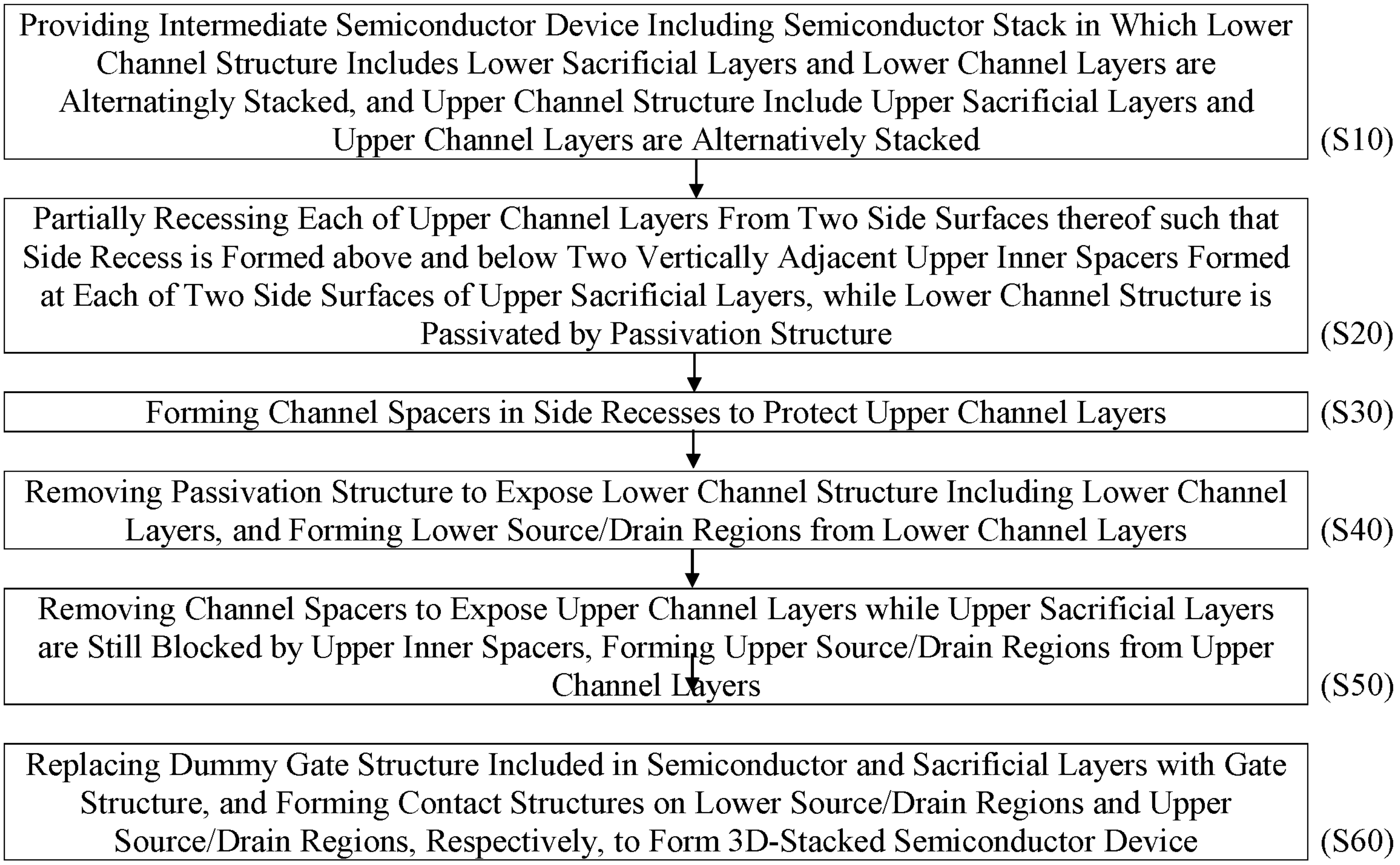
FIG. 13 illustrates a flowchart describing a method of forming a 3D-stacked semiconductor device in which source/drain regions are formed based on channel spacers, according to embodiments.

FIG. 13 illustrates a flowchart describing a method of forming a 3D-stacked semiconductor device in which source/drain regions are formed based on channel spacers, according to embodiments. This method is described herebelow in reference to FIGS. 2A-2D to 12A-12D, and thus, the same reference numbers may be used.

In step S10, an intermediate semiconductor device 10 including a semiconductor stack 10-2 is provided in which a lower channel structure 110 may include lower sacrificial layers 111 and lower channel layers 112 are alternatingly stacked, and an upper channel structure 120 may include upper sacrificial layers 121 and upper channel layers 122 are alternatively stacked. See FIGS. 2A-2D.

In the lower channel structure 110, two lower inner spacers 116 may be formed on two opposite side surfaces of each of the lower sacrificial layers 111 so that lower source/drain regions 135 may be epitaxially grown from only the lower channel layers 112 among the lower channel layers 112 and the lower sacrificial layers 111 in a later step. Similarly, in the upper channel structure 120, two upper inner spacers 126 may be formed in two opposite side surfaces of each of the upper sacrificial layers 121 so that upper source/drain regions 145 may be epitaxially grown from only the upper channel layers 122 among the upper channel layers 122 and the upper sacrificial layers 121 in a later step.

The lower channel layers 112 and the upper channel layers 122 may each have a length CL1, and the lower inner spacers 116 and the upper inner spacers 126 may each have a length SL1.

In step S20, each of the upper channel layers 122 may be partially recessed from the two side surfaces thereof such that a side recess R3 may be formed above and below two vertically adjacent upper inner spacers 126 formed at each of the two side surfaces of the upper sacrificial layers 121, while the lower channel structure 110 is passivated by a passivation structure 171. See FIGS. 3A-3B and 4A-4B.

Each of the upper channel layers 122 may be partially recessed at each of the two side surfaces thereof by a side depth DT which is smaller than the length SL1 of each of the inner spacers 116 and 126, and thus, each of the upper channel layers 122 which are partially recessed may be reduced from the length CL1 to a length CL2 by twice the side depth DT.

In step S30, channel spacers 136 may be filled in the side recesses R3 to protect the upper channel layers 122 from subsequent operations including removal of the passivation structure 171 and formation of lower source/drain regions from the lower channel layers 112 exposed by the removal of the passivation structure 171. See FIGS. 5A and 5B.

The channel spacers 136 may be formed in each of the side recesses R3 such that a length of the channel spacer 136 may have a length SL2 which is equal to the side depth DT of the recess R3.

In step S40, the passivation structure 171 may be removed to expose the lower channel structure 110 including the lower channel layers 112, and the lower source/drain regions 135 may be formed from the lower channel layers 112. See FIGS. 6A-6B to 7A-7B.

The lower source/drain regions 135 can be formed from an epitaxial growth of only the lower channel layers 112 among the lower sacrificial layers 111, the lower channel layers 112, the upper sacrificial layers 121, and the upper channel layers 122. This is because these layers except the lower channel layers 112 are blocked by the lower inner spacers 116, the upper inner spacers 126, and the channel spacers 136, respectively.

In step S50, the channel spacers 136 may be removed to expose the upper channel layers 122 while the upper sacrificial layers 121 are still blocked by the upper inner spacers 126, and the upper source/drain regions 145 may be formed from the upper channel layers 122. FIGS. 8A-8B to 10A-10D.

As the upper source/drain regions 145 may formed from the upper channel layers 122 each having the length CL2 which is smaller than the length CL1 of each of the lower channel layers 112 in the D1 direction by twice the length SL2 of the channel spacer 136 removed in the previous step, each of the upper source/drain regions 145 may have a length EL2 which may be greater than a length EL1 of the lower source/drain region 135 therebelow by twice the length SL2 of the channel spacer 136.

Further, when the channel spacers 136 are removed, corresponding portions of the upper inner spacers 126 may also be removed by the same length SL2, and thus, the remaining portions of the upper inner spacers 126 may have a length SL3 which is smaller than the length SL1 of the lower inner spacers 116 by the length SL2 of the channel spacer 136.

In step S60, a dummy gate structure included in the semiconductor stack 10-2 and the sacrificial layers 111 and 121 may be removed and replaced by a gate structure, and contact structures 119 and 129 may be formed on the lower source/drain regions 135 and the upper source/drain regions 145, respectively, to form the 3D-stacked semiconductor device in which the source/drain regions are formed using the channel spacers. See FIGS. 11A-11D and 12A-12D.

In the above embodiments, the channel spacers 136 are formed and used to form a 3D-stacked semiconductor device in which the upper channel structure 120 for an upper transistor has a smaller width than the lower channel structure 110 for a lower transistor to facilitate the lower contact structure 119 on the top surface of the lower source/drain region 135. However, the disclosure is not limited thereto, and the channel spacers 136 may also be formed and used in manufacturing a 3D-stacked semiconductor device in which an upper channel structure and a lower channel structure have the same width, according to embodiments.

Further, in the above embodiments, the channel spacers 136 are formed and used form a 3D-stacked semiconductor device in which each of the lower transistor and the upper transistor is a nanosheet field-effect transistor. However, the disclosure is not limited thereto, and at least one of the lower transistor and the upper transistor may be a FinFET, according to embodiments.

Figure 14:
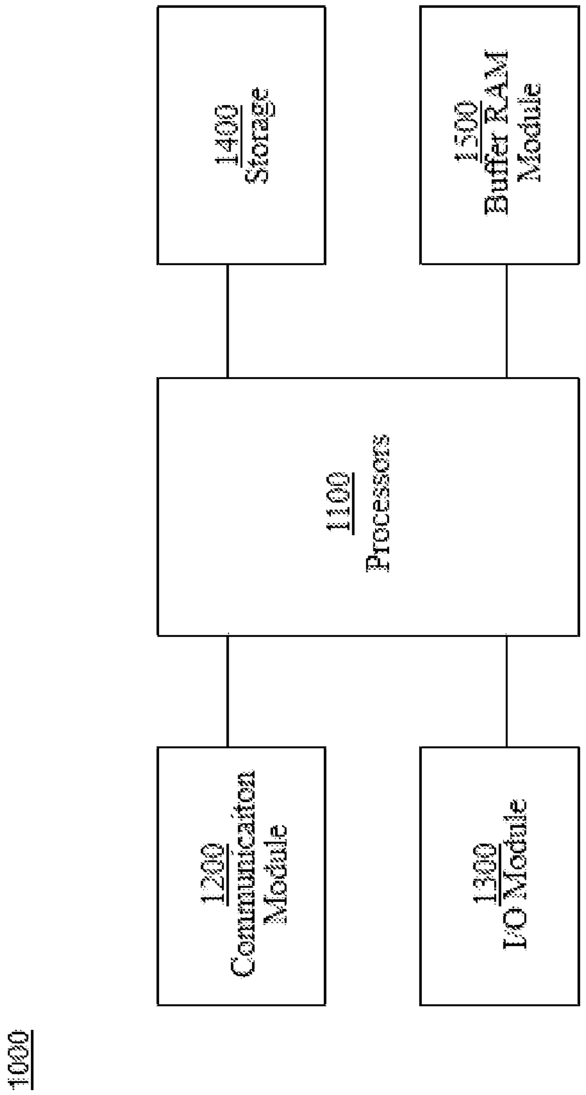
FIG. 14 is a schematic block diagram illustrating an electronic device including a 3D-stacked semiconductor device in which source/drain regions are formed using channel spacers as shown in FIGS. 2A-2D to FIGS. 12A-12D and FIG. 13, according to an embodiment.

FIG. 14 is a schematic block diagram illustrating an electronic device including a 3D-stacked semiconductor device in which source/drain regions are formed using channel spacers as shown in FIGS. 2A-2D to FIGS. 12A-12D and FIG. 13, according to an embodiment.

Referring to FIG. 14, an electronic device 1000 may include at least one processor 1100, a communication module 1200, an input/output module 1300, a storage 1400, and a buffer random access memory (RAM) module 1500. The electronic device 1000 may be a mobile device such as a smartphone or a tablet computer, not being limited thereto, according to embodiments.

The processor 1100 may include a central processing unit (CPU), a graphic processing unit (GPU) and/or any other processors that control operations of the electronic device 1000. The communication module 1200 may be implemented to perform wireless or wire communications with an external device. The input/output module 1300 may include at least one of a touch sensor, a touch panel a key board, a mouse, a proximate sensor, a microphone, etc. to receive an input, and at least one of a display, a speaker, etc. to generate an output signal processed by the processor 1100. The storage 1400 may be implemented to store user data input through the input/output module 1300, the output signal, etc. The storage 1400 may be an embedded multimedia card (eMMC), a solid state drive (SSD), a universal flash storage (UFS) device, etc.

The buffer RAM module 1500 may temporarily store data used for processing operations of the electronic device 1000. For example, the buffer RAM 1500 may include a volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 14, the electronic device 1000 may further include at least one sensor such as an image sensor.

At least one component in the electronic device 1000 may be formed based on at least one of the 3D-stacked semiconductor device manufactured as shown in FIGS. 2A-2D to FIGS. 12A-12D and FIG. 13, according to embodiments.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A three-dimension (3D) stacked semiconductor device comprising:

- a $1^{st}$ source/drain region connected to a $1^{st}$ channel structure;
- a $2^{nd}$ source/drain region, above the $1^{st}$ source/drain region, connected to a $2^{nd}$ channel structure above the $1^{st}$ channel structure;
- a gate structure surrounding the $1^{st}$ channel structure and the $2^{nd}$ channel structure;
- a $1^{st}$ inner spacer between a $1^{st}$ portion of the gate structure and the $1^{st}$ source/drain region; and
- a $2^{nd}$ inner spacer between a $2^{nd}$ portion of the gate structure and the $2^{nd}$ source/drain region,
- wherein the $2^{nd}$ channel structure has a smaller length than the $1^{st}$ channel structure in a channel-length direction, in which the $2^{nd}$ source/drain region is connected to a $3^{rd}$ source/drain region through the $2^{nd}$ channel structure,
- wherein the $2^{nd}$ inner spacer has a smaller length than the $1^{st}$ inner spacer in the channel-length direction, and
- wherein the $2^{nd}$ source/drain region has a greater length than the $1^{st}$ source/drain region in the channel-length direction.

2. The 3D-stacked semiconductor device of claim 1, wherein each of the $1^{st}$ channel structure and the $2^{nd}$ channel structure comprises a plurality of channel layers vertically stacked with a portion of a gate structure therebetween.

3. The 3D-stacked semiconductor device of claim 1, wherein the $2^{nd}$ source/drain region has a greater length than the $1^{st}$ source/drain region in the channel-length direction.

4. The 3D-stacked semiconductor device of claim 3, wherein the $2^{nd}$ source/drain region has a smaller width than the $1^{st}$ source/drain region in a channel-width direction, which intersects the channel-length direction.

5. The 3D-stacked semiconductor device of claim 4, wherein the $2^{nd}$ channel structure has a smaller width than the $1^{st}$ channel structure in the channel-width direction.

6. The 3D-stacked semiconductor device of claim 5, wherein each of the $1^{st}$ channel structure and the $2^{nd}$ channel structure comprises a plurality of channel layers vertically stacked with a portion of a gate structure therebetween.

7. A three-dimension (3D) stacked semiconductor device comprising:

- a $1^{st}$ source/drain region connected to a $1^{st}$ channel structure;
- a $2^{nd}$ source/drain region, above the $1^{st}$ source/drain region, connected to a $2^{nd}$ channel structure above the $1^{st}$ channel structure;
- a gate structure surrounding the $1^{st}$ channel structure and the $2^{nd}$ channel structure;
- a $1^{st}$ inner spacer between a $1^{st}$ portion of the gate structure and the $1^{st}$ source/drain region; and
- a $2^{nd}$ inner spacer between a $2^{nd}$ portion of the gate structure and the $2^{nd}$ source/drain region,
- wherein the $2^{nd}$ source/drain region has a greater length than the $1^{st}$ source/drain region in a channel-length direction, in which the $2^{nd}$ source/drain region is connected to a $3^{rd}$ source/drain region through the $2^{nd}$ channel structure, and
- wherein the $2^{nd}$ inner spacer has a smaller length than the $1^{st}$ inner spacer in the channel-length direction.

8. The 3D-stacked semiconductor device of claim 7, wherein the $2^{nd}$ channel structure has a smaller length than the $1^{st}$ channel structure in the channel-length direction.

9. The 3D-stacked semiconductor device of claim 8, wherein each of the $1^{st}$ channel structure and the $2^{nd}$ channel structure comprises a plurality of channel layers vertically stacked with a portion of a gate structure therebetween.

10. The 3D-stacked semiconductor device of claim 7, wherein the $2^{nd}$ channel structure has a smaller length than the $1^{st}$ channel structure in the channel-length direction.

11. The 3D-stacked semiconductor device of claim 7, wherein the $2^{nd}$ source/drain region has a smaller width than the $1^{st}$ source/drain region in a channel-width direction, which intersects the channel-length direction.

12. The 3D-stacked semiconductor device of claim 11, wherein the $2^{nd}$ channel structure has a smaller length than the $1^{st}$ channel structure in a channel-length direction.

13. The 3D-stacked semiconductor device of claim 12, wherein the $2^{nd}$ channel structure has a smaller width than the $1^{st}$ channel structure in the channel-width direction.

14. A three-dimension (3D) stacked semiconductor device comprising:

a $1^{st}$ source/drain region connected to a $1^{st}$ channel structure;

a $2^{nd}$ source/drain region, above the $1^{st}$ source/drain region, connected to a $2^{nd}$ channel structure above the $1^{st}$ channel structure;

a gate structure surrounding the $1^{st}$ channel structure and the $2^{nd}$ channel structure;

a $1^{st}$ inner spacer between a $1^{st}$ portion of the gate structure and the $1^{st}$ source/drain region; and a $2^{nd}$ inner spacer between a $2^{nd}$ portion of the gate structure and the $2^{nd}$ source/drain region, wherein the $2^{nd}$ inner spacer has a smaller length than the $1^{st}$ inner spacer in a channel-length direction, in which the $2^{nd}$ source/drain region is connected to a $3^{rd}$ source/drain region through the $2^{nd}$ channel structure, and wherein the $2^{nd}$ source/drain region has a smaller width than the $1^{st}$ source/drain region in a channel-width direction, which intersects the channel-length direction.

15. The 3D-stacked semiconductor device of claim 14, wherein the $2^{nd}$ channel structure has a smaller length than the $1^{st}$ channel structure in the channel-length direction.

16. The 3D-stacked semiconductor device of claim 14, wherein the $2^{nd}$ source/drain region has a greater length than the $1^{st}$ source/drain region in the channel-length direction.

* * * * *